(12) United States Patent       (10) Patent No.:     US 7,808,221 B2
Lin                             (45) Date of Patent:      Oct. 5, 2010

(54) CURRENT REGULATION MODULE

(75) Inventor: Ray-Lee Lin, Tainan (TW)

(73) Assignee: National Cheng Kung University, Tainan (TW)

(*) Notice: Subject to any disclaimer, the term of this patent is extended or adjusted under 35 U.S.C. 154(b) by 249 days.

(21) Appl. No.: 12/003,364

(22) Filed: Dec. 21, 2007

(65) Prior Publication Data

US 2008/0106242 A1    May 8, 2008

Related U.S. Application Data

(63) Continuation-in-part of application No. 11/299,890, filed on Dec. 13, 2005, now abandoned.

(30) Foreign Application Priority Data

Dec. 15, 2004  (TW) ............................. 93138844 A

(51) Int. Cl.
G05F 1/00      (2006.01)
G05F 1/573     (2006.01)
(52) U.S. Cl. ................... 323/269; 323/271; 323/277
(58) Field of Classification Search ............ 323/266, 323/212, 217, 222, 225, 226, 269, 271, 273, 323/274, 277
See application file for complete search history.

(56) References Cited

U.S. PATENT DOCUMENTS

| 5,144,222 | A |   | 9/1992  | Herbert          |         |
|-----------|---|---|---------|------------------|---------|
| 5,162,631 | A |   | 11/1992 | Hachisuka et al. |         |
| 5,200,692 | A |   | 4/1993  | Krinsky et al.   |         |
| 5,448,155 | A |   | 9/1995  | Jutras           |         |
| 5,592,072 | A |   | 1/1997  | Brown            |         |
| 5,619,119 | A |   | 4/1997  | Pelletier et al. |         |
| 5,750,951 | A |   | 5/1998  | Kaneko et al.    |         |
| 5,770,831 | A |   | 6/1998  | Kaneko et al.    |         |
| 5,770,940 | A | * | 6/1998  | Goder            | 323/282 |
| 5,897,792 | A |   | 4/1999  | Kaneko et al.    |         |
| 6,130,526 | A | * | 10/2000 | Yang et al.      | 323/272 |
| 6,518,738 | B1| * | 2/2003  | Wang             | 323/284 |
| 6,583,520 | B2| * | 6/2003  | Shi et al.       | 307/33  |

(Continued)

OTHER PUBLICATIONS

Casanueva et al., "Series-Parallel Resonant Coverter for an EDM Power Supply", Jun. 10, 2004; Journal of Material Processing Technology; vol. 149, Issues 1-3; pp. 172-177.

(Continued)

*Primary Examiner*—Adolf Berhane
*Assistant Examiner*—Emily Pham
(74) *Attorney, Agent, or Firm*—Muncy, Geissler, Olds & Lowe, PLLC

(57) ABSTRACT

The present invention discloses a current regulation module for providing a predetermined current. The current regulation module comprises a linear power conversion circuit, a switching power conversion circuit, a current detector, and a controller. The current detector is used to detect the output current of the current regulation module and output a detected current value. The controller control the switches in the linear power conversion circuit and the switching power conversion circuit in accordance with the detected current value, to strengthen the dynamic response ability to the sudden change in the output current.

6 Claims, 9 Drawing Sheets

U.S. PATENT DOCUMENTS

| | | |
|---|---|---|
| 6,661,210 B2 | 12/2003 | Kimball et al. |
| 6,686,727 B2 | 2/2004 | Ledenev et al. |
| 6,700,803 B2 | 3/2004 | Krein |
| 7,058,373 B2 * | 6/2006 | Grigore .................. 455/127.1 |
| 2003/0117117 A1 * | 6/2003 | Zinn et al. ................. 323/273 |
| 2004/0095104 A1 * | 5/2004 | Brooks ...................... 323/272 |

OTHER PUBLICATIONS

Casanueva et al., "Analysis Design and Experimental Result of a High-Frequency Power Supply for Spark Erosion", Mar. 2005; IEEE Transaction on Power Electronics; vol. 20, No. 2; pp. 361-369.

* cited by examiner

US 7,808,221 B2

CURRENT REGULATION MODULE

CROSS-REFERENCE TO RELATED APPLICATION

This application is a continuation-in-part of U.S. application Ser. No. 11/299,890, filed on Dec. 13, 2005 now abandoned, hereby incorporated by reference as it fully set forth herein.

FIELD OF THE INVENTION

The present invention relates to a power conversion apparatus, and more particularly, to a current regulation module providing a predetermined current.

BACKGROUND OF THE INVENTION

Electrical machining involves machining metal materials by melting them in electrolyte or by directly etching them by electricity. Electrical discharge machining (EDM) is a non-contact machining method; that is, there is always a gap between the tool and the workpiece such that there is no mechanical force on the workpiece. Thus, EDM is suitable for machining delicate, tiny workpieces and complexly shaped workpieces, thin walls of which are easily misshaped.

At present, EDM is based on etching by electrical pulse discharging. The tool and the workpiece are electrically connected to each side of the pulse power, respectively. The difference between EDM and electrolytic machining is that the tool, one electrode, is consumed during machining. Therefore, the material used for the electrode and the machining parameters should be chosen carefully and the size of the electrode should also be designed reasonably to decrease machining inaccuracy caused by the consumption of the electrode.

However, since the gap for electrical discharging needs to be very small and since the tool and the workpiece are constantly being etched away during machining, discharging quickly ceases because the gap widens. Therefore, the machining system needs to have a server control feeding system with high accuracy to constantly feed the electrode and to automatically keep the discharging gap at a best distance.

Reference is made to FIGS. 1 to 3, which illustrate conventional power conversion apparatuses for electrical discharge machining. Since the linear power converter is used as the main structure in the conventional power conversion apparatuses for electrical discharge machining, the output voltage and current are adjusted by using power resistor D or power transistor E working in the active region to make the voltage big enough to discharge to the workpiece A. Hence, these circuits each have low power conversion efficiency and a large circuit footprint; therefore, they are unfavorable in the industry.

Reference is made to FIG. 4, which illustrates a circuit diagram of a switching power converter. If the switching power converter B is used alone, although high power conversion efficiency and a smaller size can be achieved, desirable load current cannot be obtained, causing the slow dynamic response of the switching power converter.

In summary, the power conversion efficiency of the linear power converters is not sufficient, so the size of the power conversion apparatus of the machine becomes quite big. Moreover, although using the switching power converter alone can improve the power conversion efficiency and decrease the size of the power conversion apparatus, it cannot effectively improve its dynamic response to a sudden change in load current.

SUMMARY OF THE INVENTION

Therefore, one objective of the present invention is to provide a current regulation module to provide a predetermined current.

Another objective of the present invention is to provide a current regulation module to provide a predetermined pulse current.

According to an embodiment of the present invention, the current regulation module used to provide a load current comprises: a linear power conversion circuit, a switching power conversion circuit, a current detector, and a controller. The linear power conversion circuit is electrically connected to an outer power supply to output a load current, wherein the linear power conversion circuit comprises at least a first switch. The switching power conversion circuit is electrically connected to the outer power supply, wherein the switching power conversion circuit comprises at least a second switch. The current detector is used to detect the load current to output a detected current value. The controller is used to control the first switches and the second switches in accordance with the detected current value to make the linear power conversion circuit strengthen the dynamic response ability to the sudden change in the load current, and make the switching power conversion circuit strengthen the dynamic response ability to the sudden change in the load current.

According to another embodiment of the present invention, the current regulation module further comprises an energy-regenerate circuit electrically connected to the switching power conversion circuit, when the first switches and the second switches are turned off, the energy-regenerate circuit receives the electrical energy on the switching power conversion circuit to make the value of the load current equal to zero.

The property of the linear power conversion circuit, the fast response to changes in the output load, is used to adjust the output current. The magnitude or the waveform of the current through the workpiece is adjusted by the linear power conversion circuit or the switching power conversion circuit. Hence, the goal of high power conversion efficiency, high power density, and small size are achieved.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In order to make the illustration of the present invention more explicit and complete, the following description is stated with reference to FIGS. 5 to 9.

Figure 1:
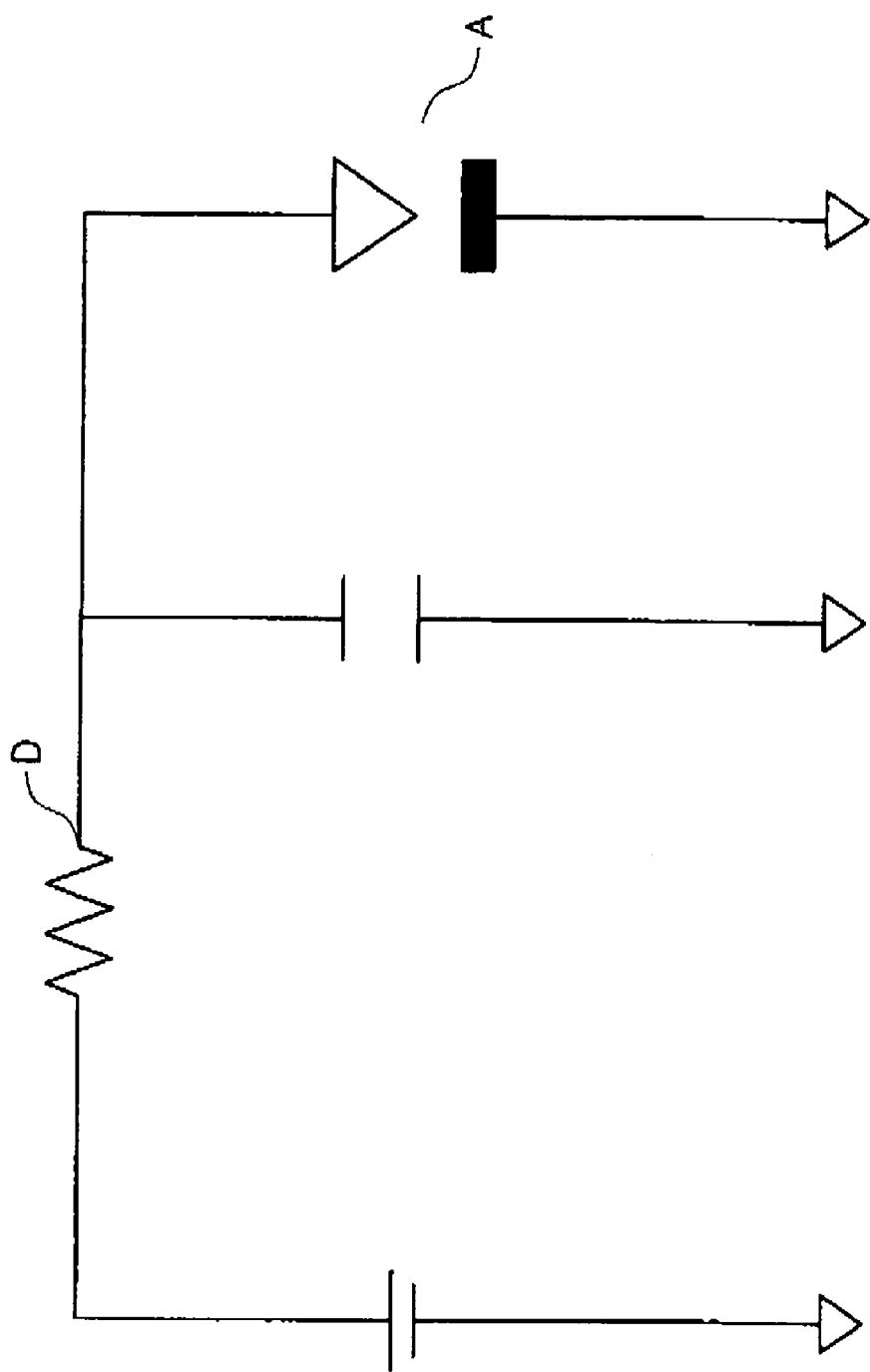
FIG. 1 illustrates the conventional linear power conversion circuit with power resistors controlling the output current.
Figure 2:
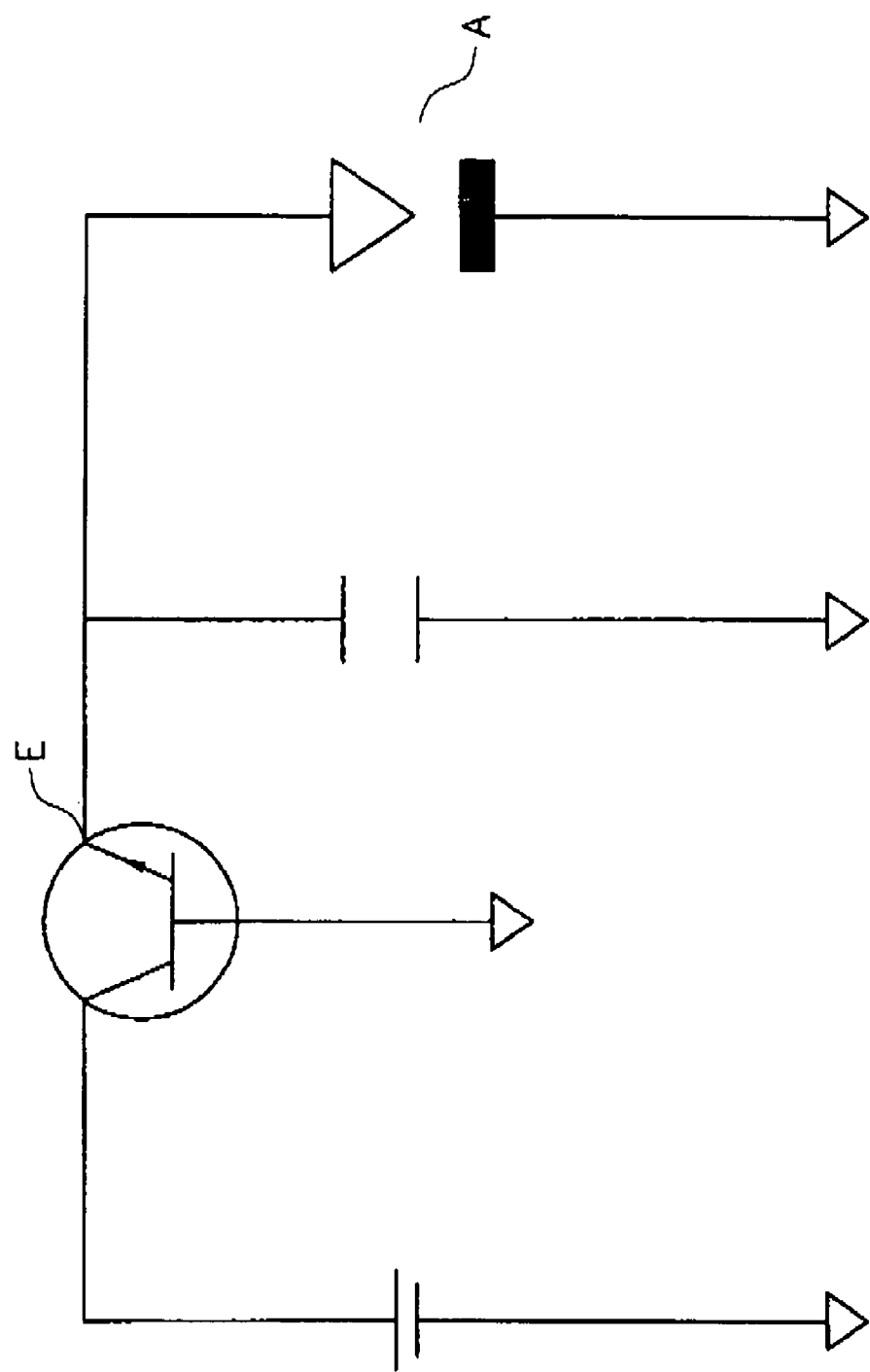
FIG. 2 illustrates the conventional linear power conversion circuit with power transistors controlling the output current.
Figure 3:
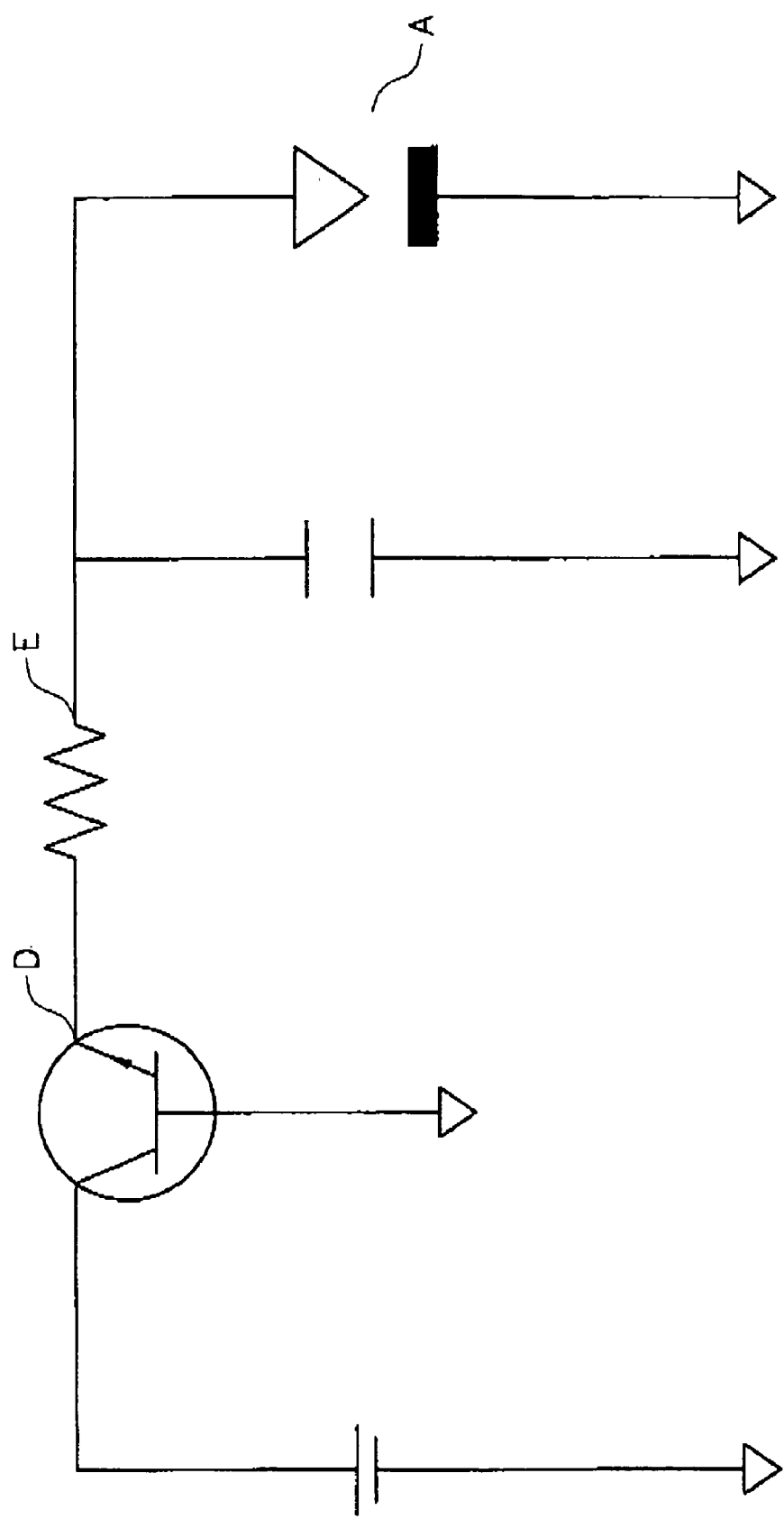
FIG. 3 illustrates the conventional linear power conversion circuit with power resistors and power transistors controlling the output current.
Figure 4:
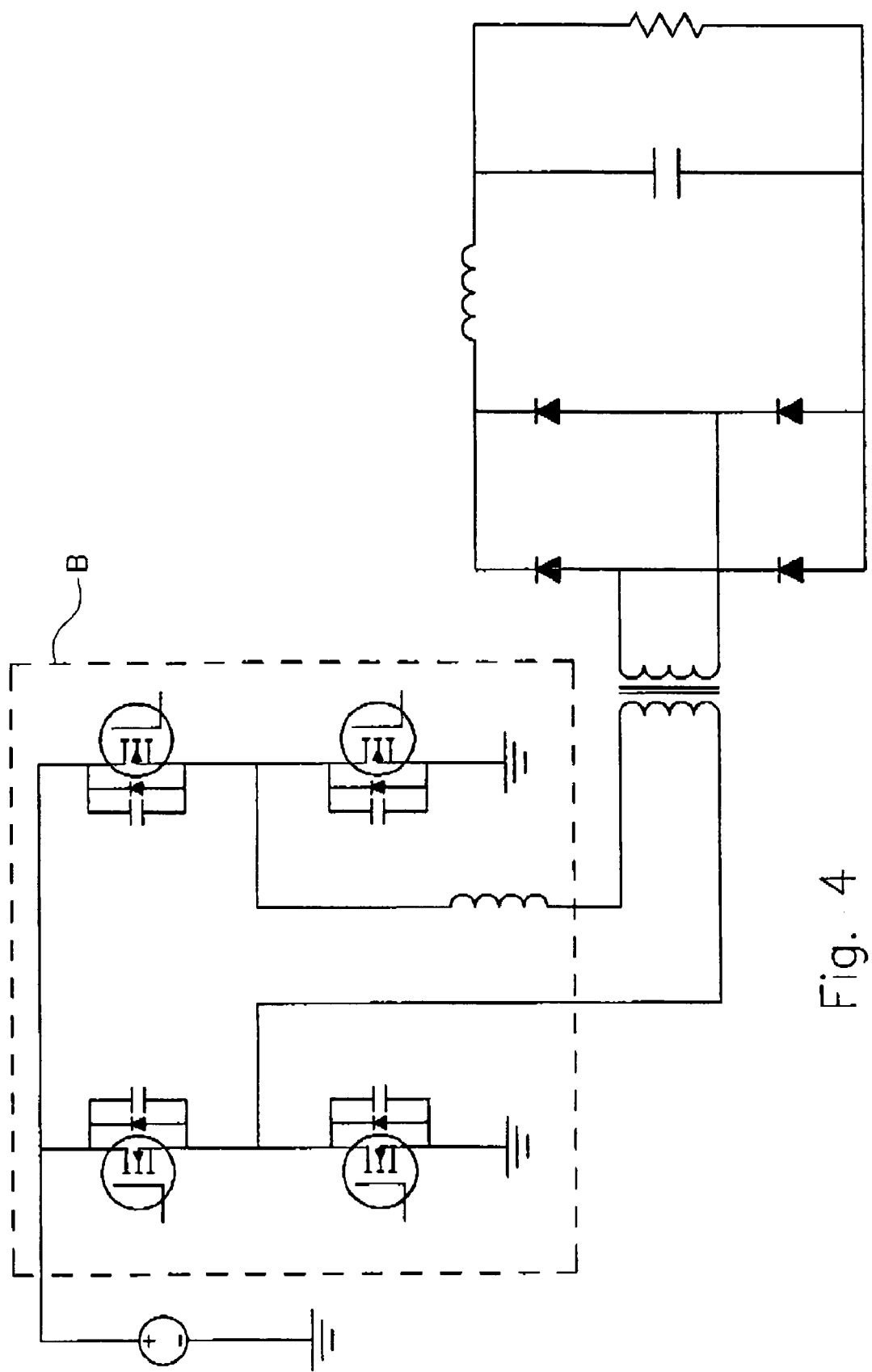
FIG. 4 illustrates the switching power conversion circuit of the conventional electrical discharge machine.
Figure 5:
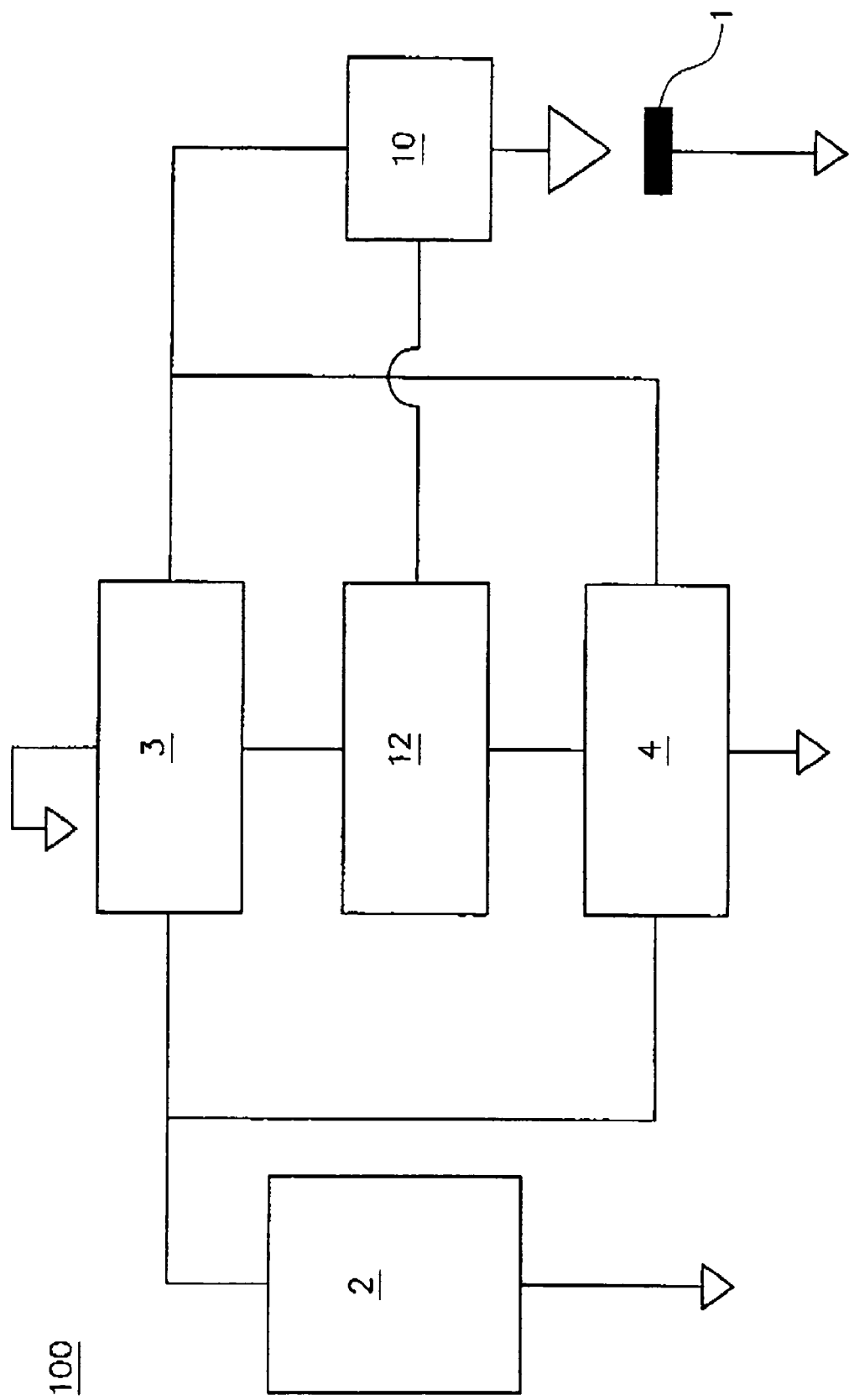
FIG. 5 is a block diagram of the current regulation module according to the current regulation module.

Reference is made to FIG. 5, illustrating a block diagram of a current regulation module 100 according to a first embodiment of the present invention. The current regulation module 100 comprises a linear power conversion circuit 3, a switching power conversion circuit 4, a current detector 10, and a controller 12, wherein the linear power conversion circuit 3 comprises at least a first switch and the switching power conversion circuit 4 comprises at least a second switch. The linear power conversion circuit 3 electrically connected to an outer power supply 2, supplies a load current to the workpiece 1 and control the current value thereof. The current detector 10 is used to detect the load current to output a detected current value. The controller 12 is used to control the first and second switches in accordance with the detected current value, thus that the linear power conversion circuit 3 can strengthen the dynamic response to sudden changes in the pulse current, and the switching power conversion circuit 4 can strengthen the pulse current by phase-shifting to make the pulse current have better dynamic response during the sudden change in the load current. The switching power conversion circuit 4 is selected from the group consisting of a buck power conversion circuit, a boost power conversion circuit a buck-boost power conversion circuit, a forward power conversion circuit a flyback power conversion circuit, a push-pull power conversion circuit, a half-bridge power conversion circuit, an asymmetrical half-bridge power conversion circuit, and a full-bridge power conversion circuit.

When a DC current is input from the outer power supply 2, the DC current is input simultaneously to the linear power conversion circuit 3 and the switching power conversion circuit 4. With the fast response of the linear power conversion circuit 3, the load current is supplied to a workpiece 1 in a very short time, and another part of the current is compensated by the switching power conversion circuit 4. Hence, the dynamic response to sudden changes in the load current is strengthened, and the load current is therefore regulated variously for different loads during power conversion of different instruments. The current regulation module 100 is suitable for the power conversion apparatus such as the electrical discharge machine or the current source power supply owing to the fast response and high power conversion efficiency.

Figure 6:
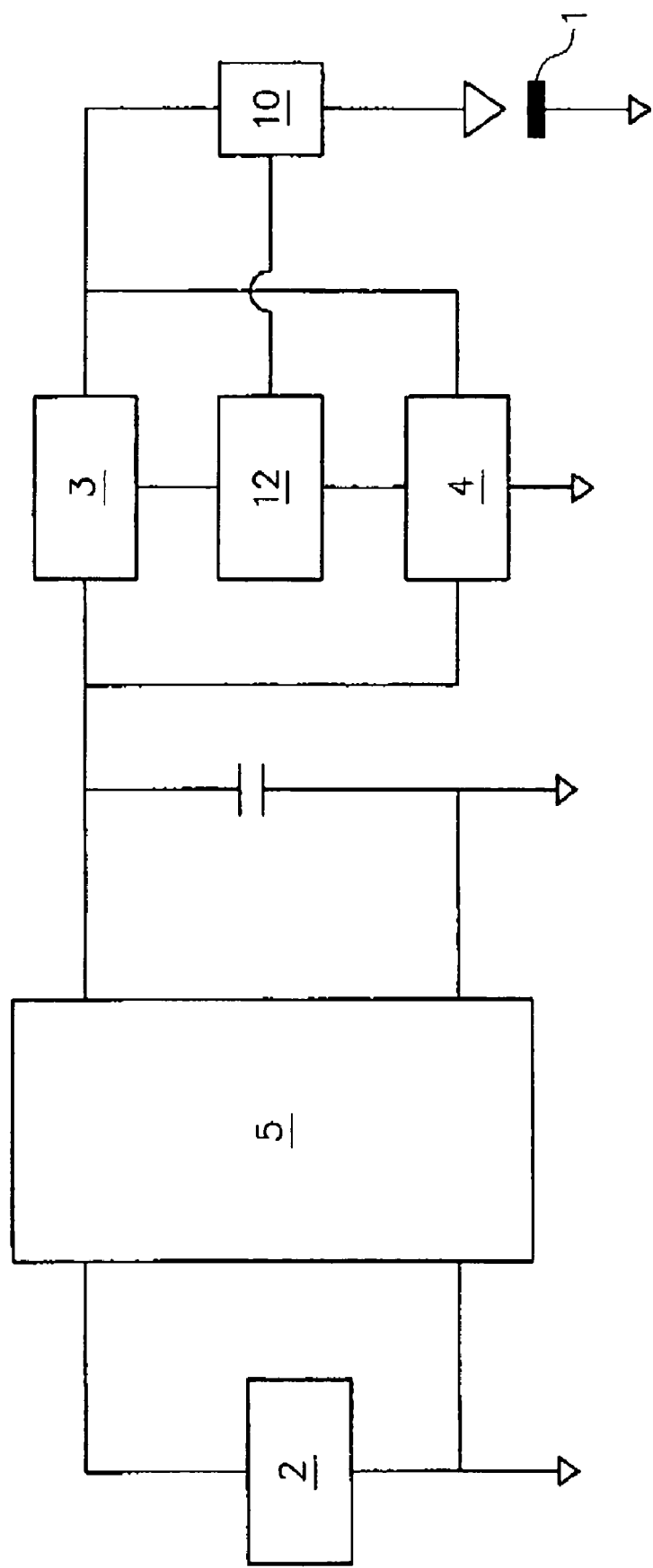
FIG. 6 is a block diagram of the current regulation module according to the second embodiment of the present invention.

Reference is made to FIG. 6, illustrating a current regulation module 200 according to a second embodiment of the present invention. When the outer power supply 2 is an AC power supply, a switching AC-DC converter 5 can be electrically connected to the outer power supply 2 before the power is supplied to the linear power conversion circuit 3 and the switching power conversion circuit 4. The switching AC-DC converter 5 can convert the AC power supplied by the outer power supply 2 into DC power. Then, with the combination of the linear power conversion circuit 3, having fast response to sudden changes in load current, and the switching power conversion circuit 4, having high power conversion efficiency and high power density, a stable current is output to the workpiece 1.

Figure 7:
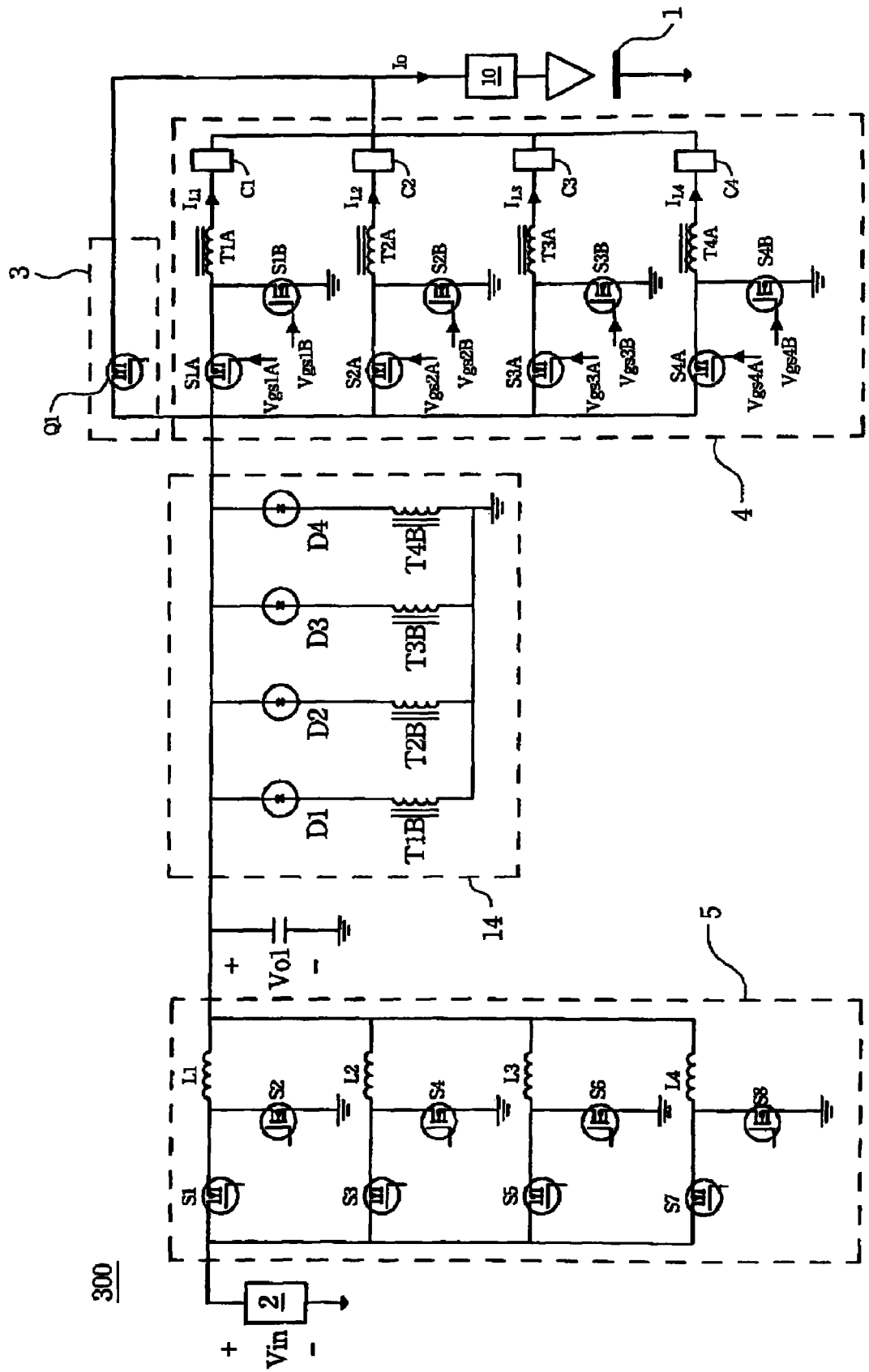
FIG. 7 is a block diagram of the current regulation module according to the third embodiment of the present invention.
Figure 8:
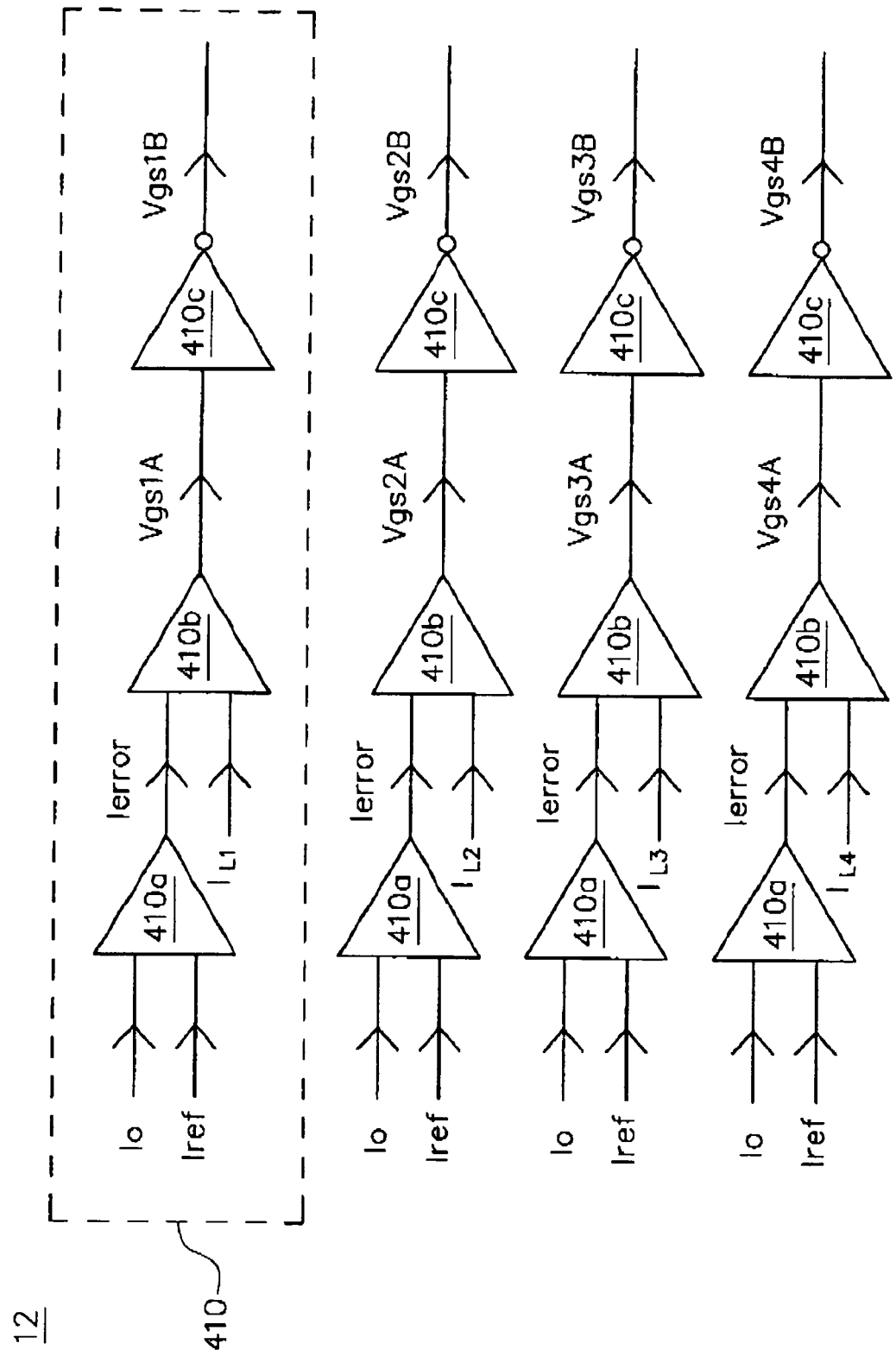
FIG. 8 illustrates a structure diagram of the controller according to the third embodiment of the present invention.
Figure 9:
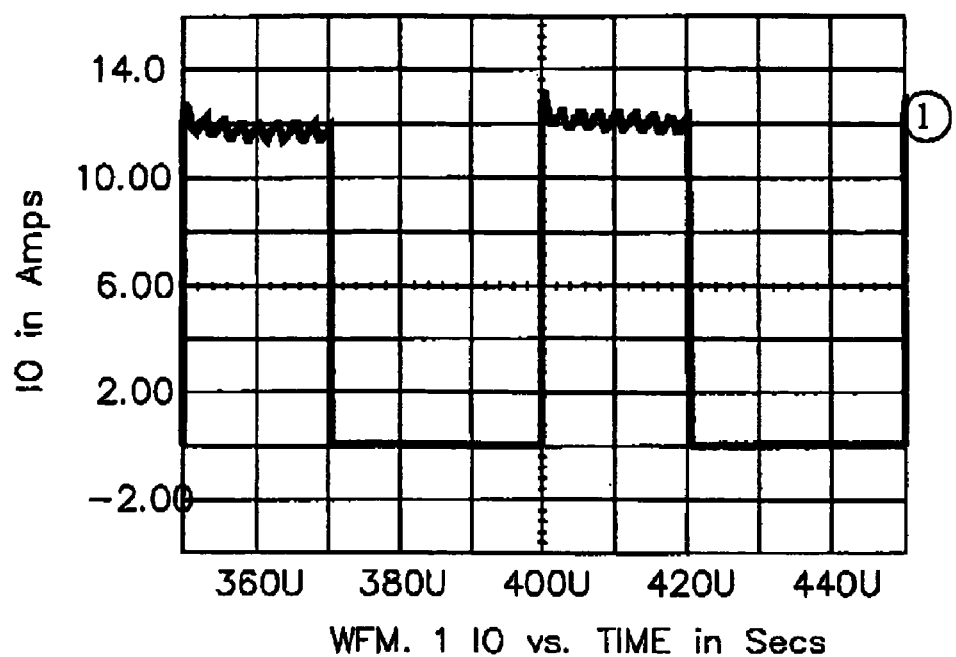
FIG. 9 illustrates the waveform of the output pulse current with frequency being 50 kHz.

Reference is made to FIG. 7 and FIG. 8, FIG. 7 illustrates a current regulation module 300 according to a third preferred embodiment of the present invention. FIG. 8 illustrates a structure diagram of the controller 12 according to the third embodiment of the present invention. The current regulation module 300 is similar to the current regulation module 200, but the difference is in that the current regulation module 300 further comprises an energy-regenerate circuit 14. The energy-regenerate circuit 14 comprises a plurality of coupling coils T1B~T4B and a plurality of diodes D1~D4. The switching AC-DC converter 5 comprises a plurality of third switches S1~S8 and inductors L1~L4. The linear power conversion circuit 3 is composed of at least one switch Q1. The switching power conversion circuit 4 comprises a plurality of second switches S1A~S4A and S1B~S4B, coupling coils T1A~T4A and coil current detectors C1~C4, wherein the coupling coils T1A~T4A is respectively coupled to the coupling coils T1B~T4B in a one to one manner. The switching AC-DC converter 5 is a synchronous-rectifying buck converter with four phases, wherein the phase angle of each the four phases of the synchronous-rectifying buck converter with four phases 6 is 90 degrees.

The load current outputted by the current regulation module 300 is a pulse current. When the first switch Q1 and the second switches S1A~S4A are turned off, the energy stored in the coupling coils T1A~T4A can be transferred to the coupling coils T1B~T4B, thus that the value of the load current can be decreased to zero. Using the controller 12 (not shown in FIG. 7) of the current regulation module 300 to properly control the first switch, the second switches, and the third switches, the load current can become a pulse current.

The current detectors C1~C4 are electrically respectively connected to the coupling coils T1A~T4A in a one to one manner, thus that the coil currents $I_{L1}$~$I_{L4}$ pass through the coils can be detected and output to the control 12. The controller 12 comprises a plurality of control units 410. The control units 410 are used to generate control signals Vgs1A, Vgs1B, Vgs2A, Vgs2B, Vgs3A, Vgs3B, Vgs4A, and Vgs4B in accordance with the load current Io and the coil currents $I_{L1}$~$I_{L4}$, to control the second switches, wherein each of the control units 410 comprises an error amplifier 410a, a comparator 410b, and an inverter 410c. The functions of the control units 410 are similar to each other, and the followings are descriptions about the function of one of the control units 410.

The error amplifier 410a is used to generate an error signal Ierror in accordance with the load current Io and a predetermined current Iref, wherein the predetermined current Iref. The comparator 410b is used to generate the control signal Vgs1A in accordance with the coil currents $i_{L1}$ and the error signal Ierror. The inverter 410c is used to generate the control signal Vgs1B in accordance with the control signal Vgs1A.

Figure 10:
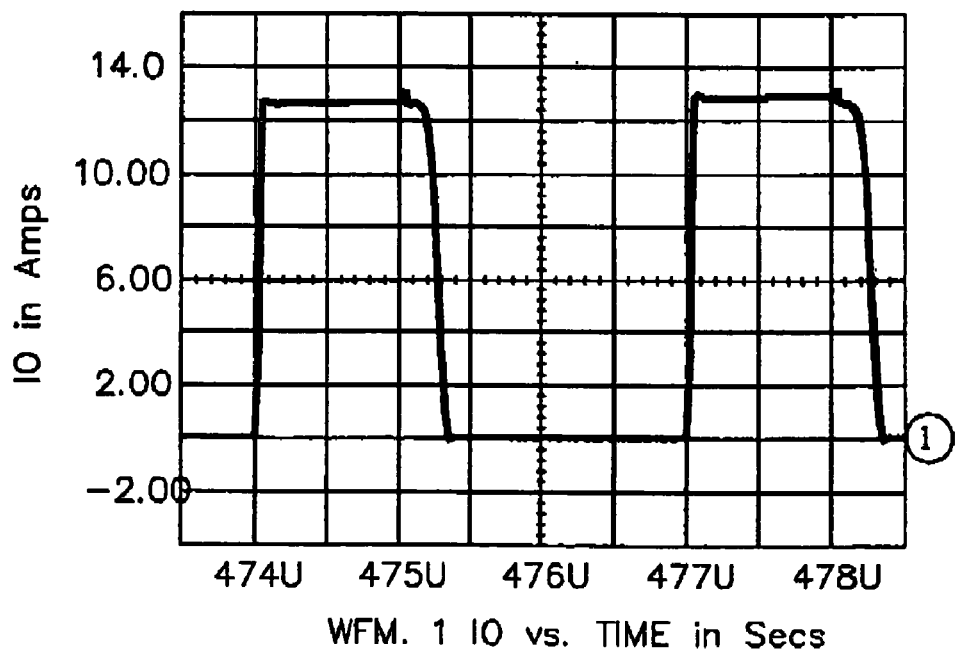
FIG. 10 illustrates the waveform of the output pulse current with frequency of 250 kHz.

The IsSpice simulation program can be used to verify the feasibility and the result of the present invention. Referring to the circuit diagram in FIG. 7, when Vin=48V, Vo1=24V, L1~LA=20 uH, the ratio of the primary winding and the secondary winding of the coupling coils is 2, the magnetizing inductance is 20 uH, and the current through the workpiece is high frequency pulse current of 12 A. These results are plotted in FIG. 9 and FIG. 10 and illustrate that the present invention quickly supplies the workpiece with currents of different frequencies.

According to the aforementioned description, the present invention has various advantages. The present invention combines the advantages of the linear power conversion circuit with the switching power conversion circuit to power the electrical discharge machining process. Thus, the response time is shortened for when the output current changes, the power conversion efficiency is increased, the power density is improved, and the physical size is reduced.

Furthermore, the parallel circuits of the linear power conversion circuit 3 and the parallel phases and angles of the switching power conversion circuit 4 can be controlled by analog circuits or by a single-chip controller or DSP controller. They can also be controlled by a PWM IC combined with analog circuits or by an PWM IC combined with a microprocessor, or controlled even by a microprocessor alone.

The present invention combines the linear power conversion circuit having fast response to sudden changes in load current with the switching power conversion circuit having high power conversion efficiency and high power density.

The current regulation module of the present invention outputs a fixed pulse current or a program controllable pulse current. It can be applied variously for different loads in power conversion of different instruments. It is suitable for a power conversion apparatus such as in an electrical discharge machine or a current source power supply due to its fast response and high power conversion efficiency, especially when the output current is pulse current.

As is understood by a person skilled in the art, the foregoing preferred embodiments of the present invention are illustrative of the present invention rather than limiting of the present invention. It is intended that various modifications and similar arrangements are included within the spirit and scope of the appended claims, the scope of which should be accorded the broadest interpretation so as to encompass all such modifications and similar structure.

What is claimed is:

1. A current regulation module, comprising:
   a linear power conversion circuit, electrically connected to an outer power supply to output a load current, wherein the linear power conversion circuit comprises at least one first switch;
   a switching power conversion circuit, electrically connected to the outer power supply, wherein the switching power conversion circuit comprises at least one second switch;
   a first current detector, used to detect the load current to output a detected current value;
   a controller, used to control the at least one first switch and the at least one second switch in accordance with the detected current value to make the linear power conversion circuit strengthen the dynamic response ability to the sudden change in the load current, and make the switching power conversion circuit strengthen the dynamic response ability to the sudden change in the load current; and
   an energy-regenerate circuit electrically connected to the switching power conversion circuit, when the at least one first switch and the at least one second switch are turned off, the energy-regenerate circuit receives the electrical energy on the switching power conversion circuit to make the value of the load current equal to zero.

2. The current regulation module according to claim 1, wherein the energy-regenerate circuit comprises at least one first coupling coils, and the switching power conversion circuit comprises at least one second coupling coils, and the first coupling coils are respectively coupled to the second coupling coils in a one to one manner.

3. The current regulation module according to claim 1, wherein the switching power conversion circuit further comprises at least one inductor and at least one second current detector, wherein the at least one second current detector is electrically connected to the at least one inductor, to detect the current passing through the at least one inductor.

4. The current regulation module according to claim 3, wherein the controller comprises at least one control unit, wherein each of the at least one control unit comprises:
   an error comparator used to generate a current error signal in accordance with the load current and a predetermined current value;
   a comparator used to generate a first switch control signal in accordance with the current error signal and one of the currents pass through the inductors; and
   an inverter used to generate a second switch control signal in accordance with the first switch control signal.

5. The current regulation module according to claim 1, wherein the linear power conversion circuit is composed of one single switch.

6. The current regulation module according to claim 1, wherein the switching power conversion circuit is selected from the group consisting of a buck power conversion circuit, a boost power conversion circuit, a buck-boost power conversion circuit, a forward power conversion circuit, a flyback power conversion circuit, a push-pull power conversion circuit, a half-bridge power conversion circuit, an asymmetrical half-bridge power conversion circuit, and a full-bridge power conversion circuit.

* * * * *